United States Patent
Green

(10) Patent No.: US 6,429,412 B1
(45) Date of Patent: Aug. 6, 2002

(54) COMBINING ELECTRONICALLY SCANNED INPUT CIRCUITS FOR READING PHOTODIODES

(75) Inventor: Paul Ernest Green, La Mirada, CA (US)

(73) Assignee: The Boeing Company, Irvine, CA (US)

( * ) Notice: Subject to any disclaimer, the term of this patent is extended or adjusted under 35 U.S.C. 154(b) by 0 days.

(21) Appl. No.: 07/767,183

(22) Filed: Sep. 30, 1991

(51) Int. Cl.$^7$ .............................................. H01L 27/00

(52) U.S. Cl. ..................................... 250/208.1; 348/300

(58) Field of Search .................. 250/208.1; 358/213.27; 348/300

(56) References Cited

U.S. PATENT DOCUMENTS 4,967,067 A * 10/1990 Hashimoto et al. ...... 250/208.1
5,043,820 A * 8/1991 Wyles et al. ......... 250/208.1 X
5,083,016 A * 1/1992 Wyles et al. ............. 250/208.1

* cited by examiner

*Primary Examiner*—Mark Hellner
(74) *Attorney, Agent, or Firm*—John R. Rafter

(57) ABSTRACT

A method and apparatus for saving space and components under detectors for staring array systems by timely combining detector inputs to a common photodiode amplifier, including establishing sequential connections from a plurality of detector inputs to a common photodiode amplifier by selecting a single path to the amplifier from each detector input at different times clamping each path to a source of potential to prevent signal transmission over the paths, and releasing said clamping of the path selected to supply the amplifier.

7 Claims, 6 Drawing Sheets

COMBINING ELECTRONICALLY SCANNED INPUT CIRCUITS FOR READING PHOTODIODES

This invention was made with Government support under Contract No. DAAB07-89-C-F203 awarded by the Army. The Government has certain rights in this invention.

BACKGROUND OF THE INVENTION

1. Field of the Invention

The present invention is a method and apparatus for improving the area available for reading and amplifying photodiode inputs to a multiplexer used with staring arrays.

2. Prior Art

Conventional staring arrays limit the photodiode input amplifier to the area available under each detector. Thus, if a detector array is on 60 microns×60 microns spacing the available area on the multiplexing array it is interfaced to is 60×60 or 3600 square microns. FIG. 1 shows the logic and single amplifier input amplifiers for a 64×64 detector array multiplexer using 60 microns detector spacing. As the detector size is reduced, the available area on the multiplexer is reduced, and room for the input amplifier becomes unavailable. If for example a 40 microns×40 microns detector spacing is chosen, the area available on the multiplexer becomes 1600 square microns, over 50 percent reduction of area.

SUMMARY OF THE INVENTION

The present invention modifies the input amplifier area by shunting a plurality of detector inputs into a common input amplifier at different times. The combination described in this invention is a four to one but any number of detectors could be combined depending on area needed and interconnecting methods. FIG. 3 gives the embodiment of the invention using a four to one combination as an example. With a four to one input to amplifier ratio, the available area of a 40 microns×40 microns detector spacing is 40×4×40 or 6400 square microns for four detectors and a common amplifier on the multiplexer array. This represents over a 50 percent improvement over the 60 microns×60 microns area, for four detectors and four amplifiers. Some of this additional area is necessary for the combining electronics but allows the 40 microns detector spacing multiplexer to have the same amplifier as the 60 microns detector spacing multiplexer. FIG. 4 shows the logic and four to one combined input amplifier for a 128×128 detector array using 40 microns detector spacing. Thus, as the detectors become smaller, this invention permits the same amplifier to be used under the smaller areas by combining a plurality of detector outputs into the common amplifier.

DETAILED DESCRIPTION OF A PREFERRED EMBODIMENT OF THE INVENTION

Figure 1:
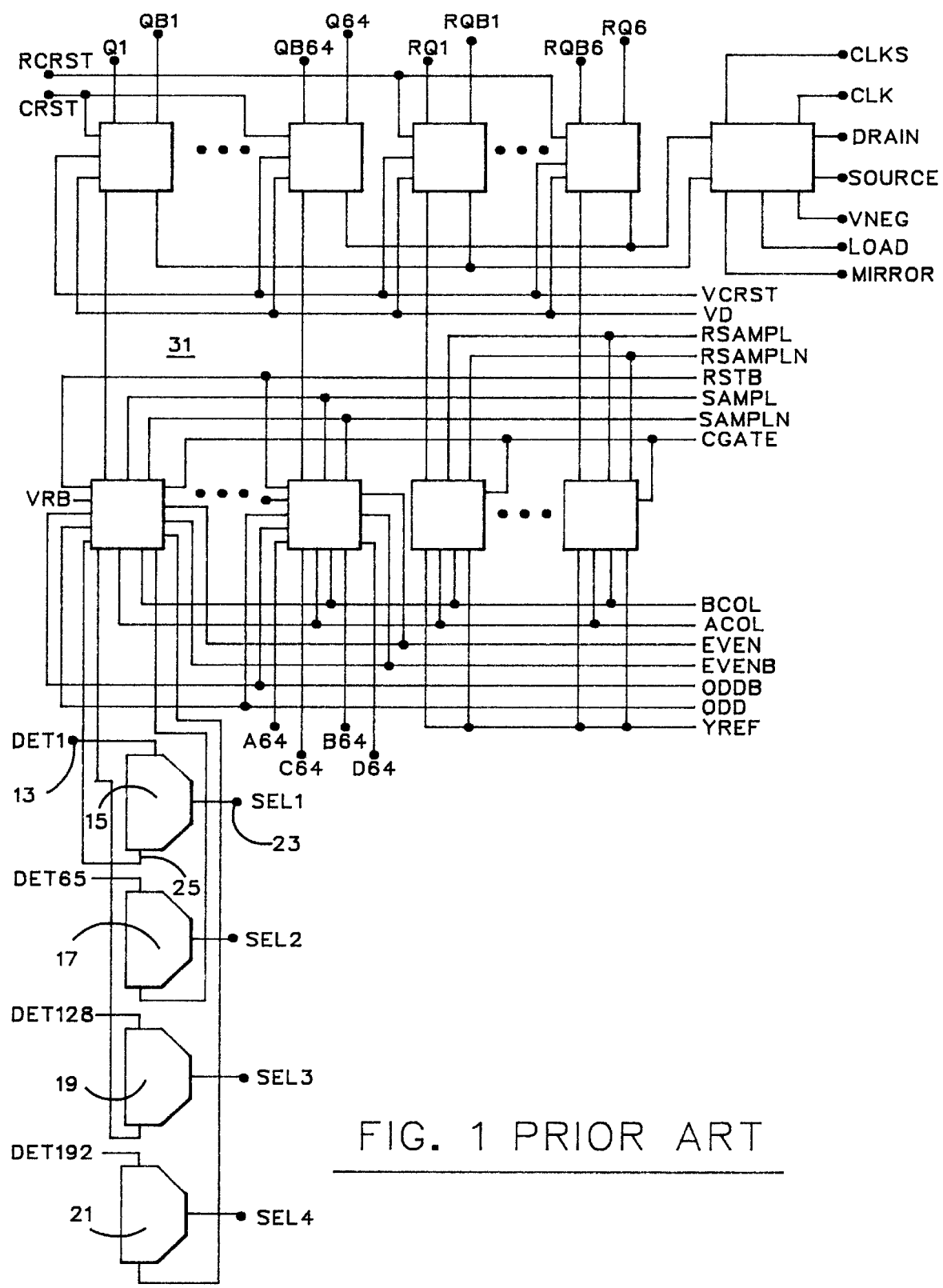
FIG. 1 depicts PRIOR ART block diagram interconnected logic and single amplifier input circuitry for a 64×64 detector array using 60 microns detector spacing.

In FIG. 1, there is seen the PRIOR ART logic and single amplifier input amplifiers arrangement for a 64×64 detector array multiplexer on 60×60 micron spacing A light to voltage detector input 13 supplies amplifier 15, which is the first amplifier of the first group of 64 detectors. Amplifiers 17, 19 and 21 are shown as the first amplifiers of groups two, three and four of FIG. 1 to receive their corresponding light to voltage signals.

Amplifier 15 is selected over lead 23 to deliver its signal over lead 25 to conventional selection and control circuitry 31. The other amplifiers 17, 19, 21 etc. are similarly selected over SEL 2, SEL 3 and SEL 4 leads to select proper rows for timely amplification.

Figure 2:
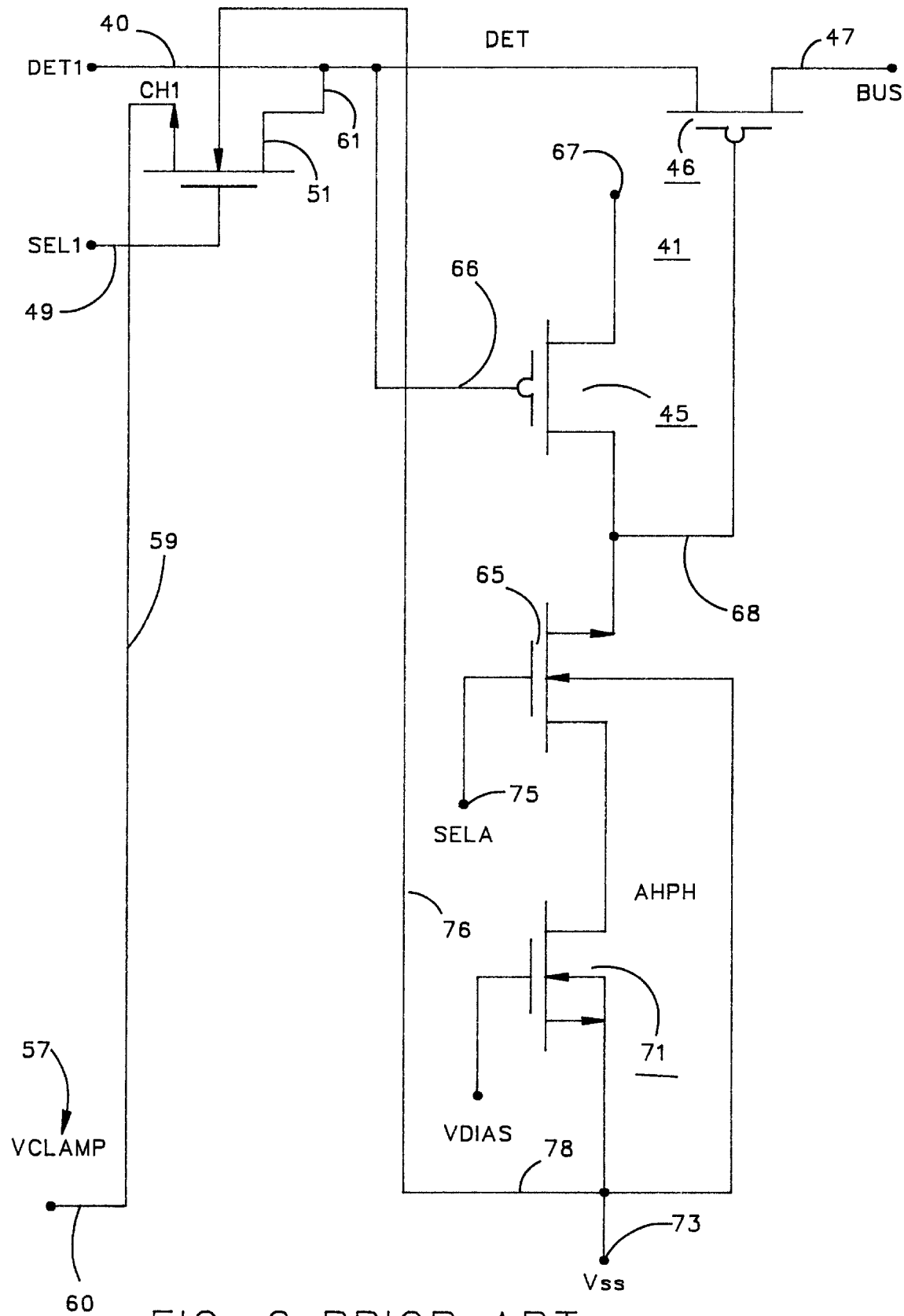
FIG. 2 shows necessary circuitry for each detector channel in the PRIOR ART.
Figure 3:
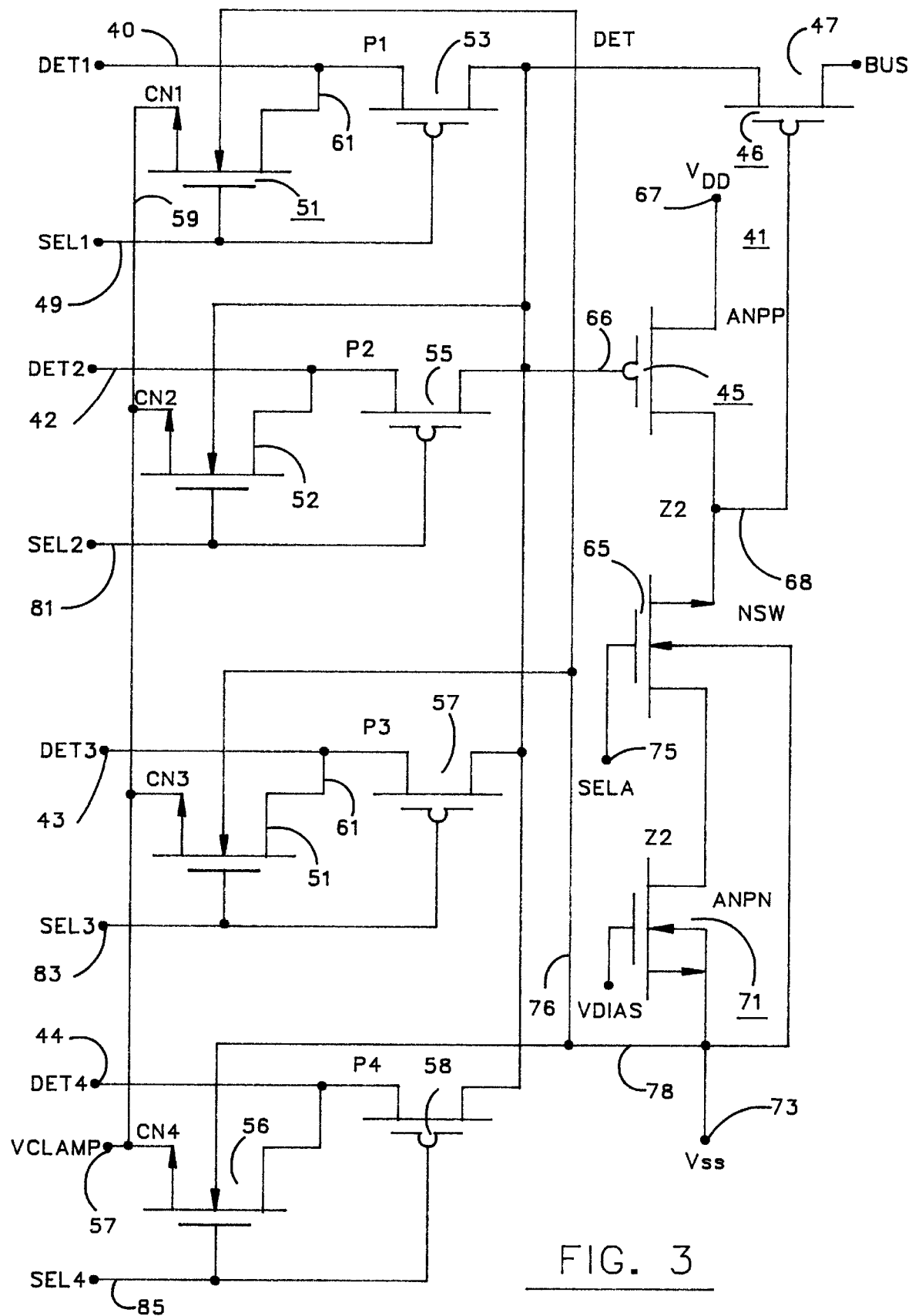
FIG. 3 shows a four to one combined input amplifier in accordance with the present invention.

In FIG. 2, a comparison of the prior art electronic amplification circuitry is presented relative to the circuitry for the present invention shown in FIG. 3. The amplifier 41 is the same for both circuits. It comprises PNP transistor 46 and PNP transistor 45. The former is connected to DET 1 line 40 for receiving and amplifying detected signals, and applying them to bus 47 for use in the integration capacitors (not shown) at the end of the bus 47.

The DET 1 signal, on lead 40, is only used for voltage integration when selected by SEL 1. Normally, SEL 1 lead 49, has 0 volts on it causing NPN transistor 51 to be on. During this condition, NPN transistor 51 is clamped to V CLAMP 57 over leads 59 and 60. Thus, DET 1, Line 40 is also clamped over NPN transistor 51 lead 61. In this manner, no integration voltage is delivered to the integration capacitors (not shown) unless SEL 1 is selected by changing its voltage level to +5 volts, at which time NPN transistor 51 goes off to relieve the clamp. At the same time SEL A 75 has an opposite polarity to SEL 1 signal applied to 75 turning the switch 65 on.

This provides $V_{DD}$ voltage from terminal 67 to lead 68 to the gate of transistor 46.

Transistor 45 is connected in a series circuit comprising NPN switching transistor 65 and NPN load transistor 71 connected to $V_{SS}$ terminal 73. The load 71 is in series with amplifier 45 when switching transistor 65 is on, which occurs so long as SEL A terminal 75 is live to turn on 65.

Transistor circuitry including transistors 51, 46, 45, 65 and 71 represent the signal circuitry which fits beneath a 60×αmicron detector. The problem was to use the same amplifier circuitry including transistors 46, 45, 65 and 71 under a smaller detector spacing area to avoid changing transistor types and resizing the circuitry, but to amplify a plurality of different detector signals.

Referring to FIG. 3, the present invention comprises connecting the DET 2 (42), DET 3 (43) and DET 4 (44) circuits with attendant SEL 2 (81), SEL 3 (83) and SEL 4 (85) circuits in a combining manner to utilize the common amplifier 41 (46, 45) and accommodate four detectors under an area of 4×40×40 microns rather than 4×60×αmicrons. Also, the V clamp 57 circuitry including the NPN transistors 51, 52, 54 and 56 were added to clamp all detector lines when not selected, thereby saving considerable power requirements while avoiding errors. Also, PNP transistors 53, 55, 57 and 58 were added to allow the detector input voltages to be selected one at a time. Also, clamping transistors 51, 52, 54, 56 and switching transistors 65 each have their semiconductor body grounded to $V_{SS}$ over common leads 76 and 78.

Figure 4:
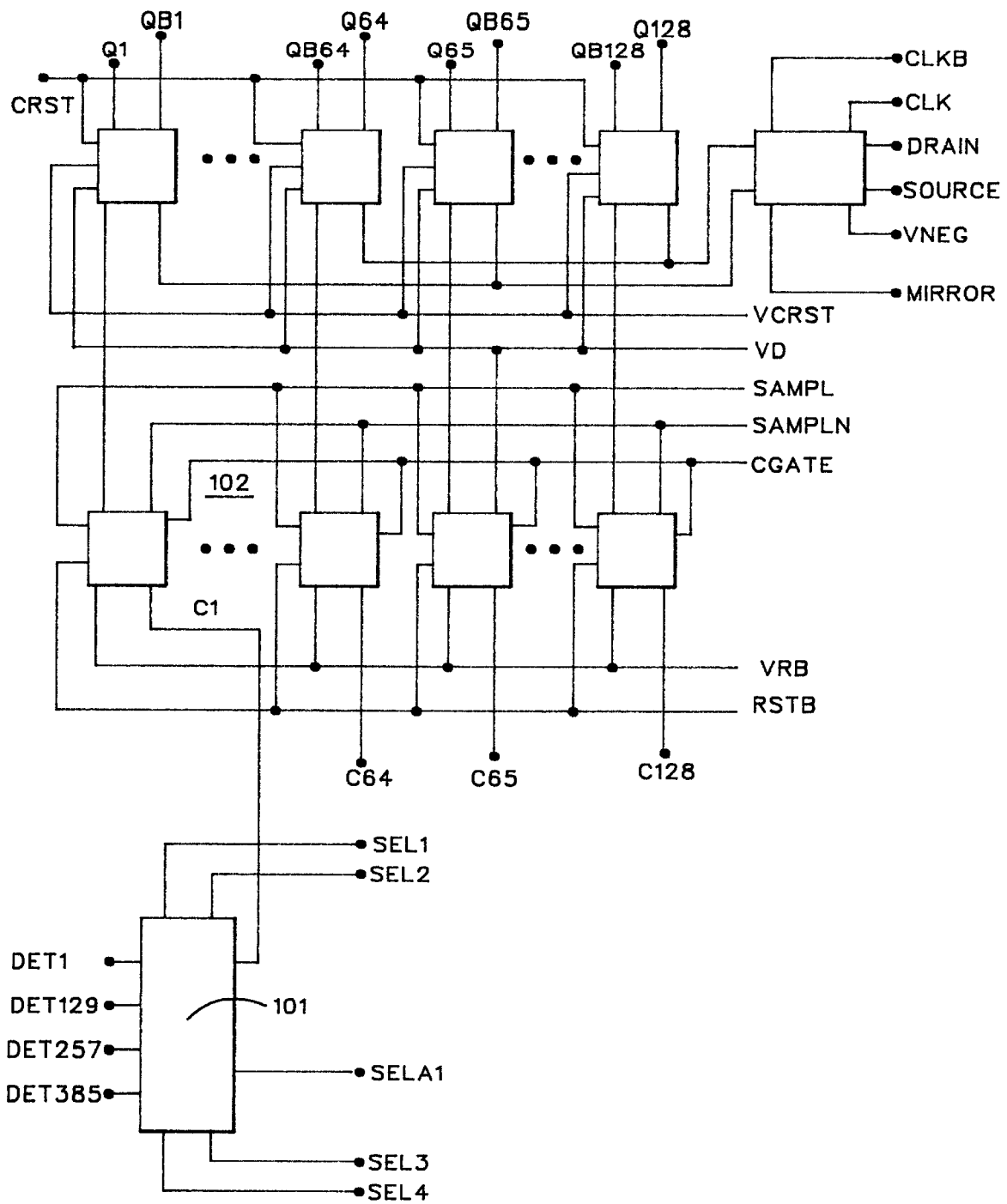
FIG. 4 illustrates Logic and four to one combined input amplifier on a 128×128 detector array using 40 micron detector spacing.

FIG. 4 shows block 101 which represents the FIG. 3 circuitry, even down to combining (multiplexing) only four detect outputs to a common amplifier, but in a 128×128 micron array. The control and timing circuitry 102 is conventional.

Figure 5:
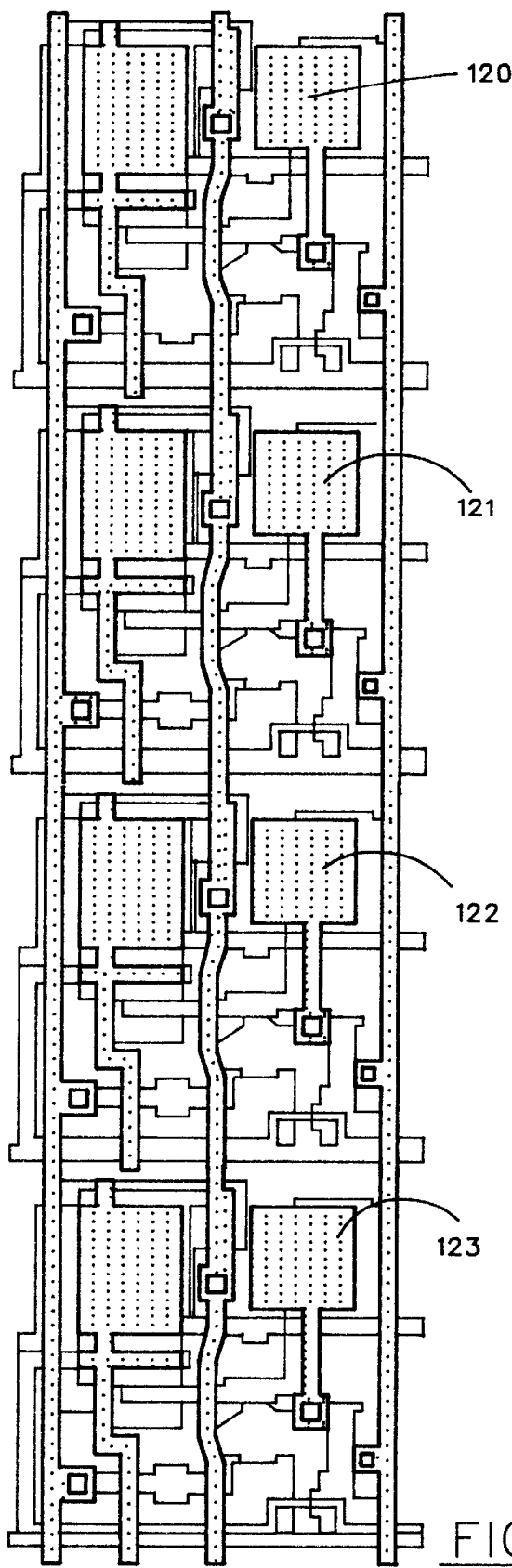
FIG. 5 is a plan view of four 60×60 micron detector amplifiers.
Figure 6:
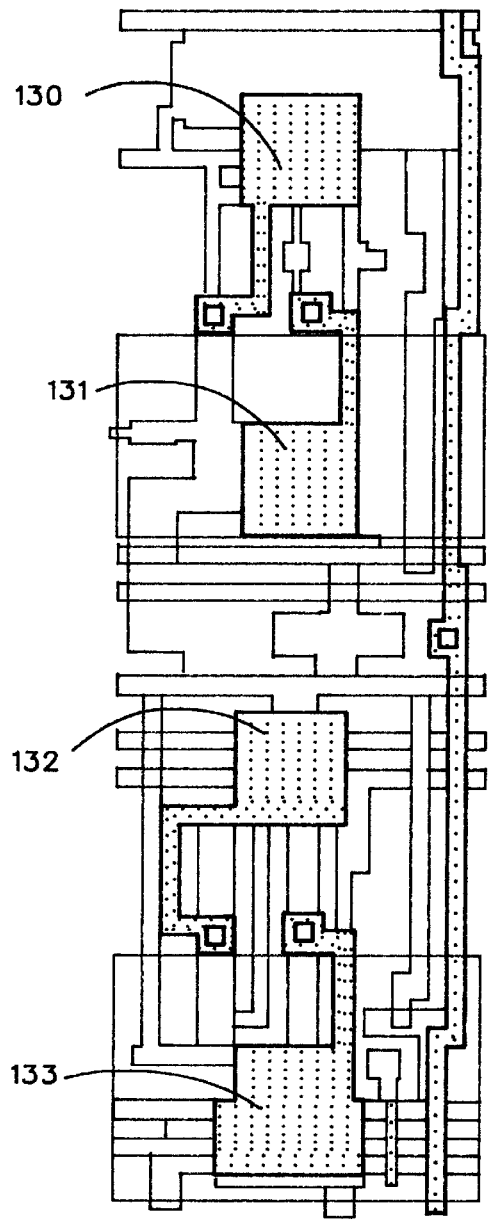
FIG. 6 shows the improved 40×40×4 detector with common amplifier for four units.

FIGS. 5 and 6 show a respective comparison between prior art four 60×αmicron detectors and, four 40×40 micron detectors in accordance with the present invention. The detector pads are shown at 120, 121, 122, 123, and 130, 131, 132 and 133, respectively.

Figure 7:
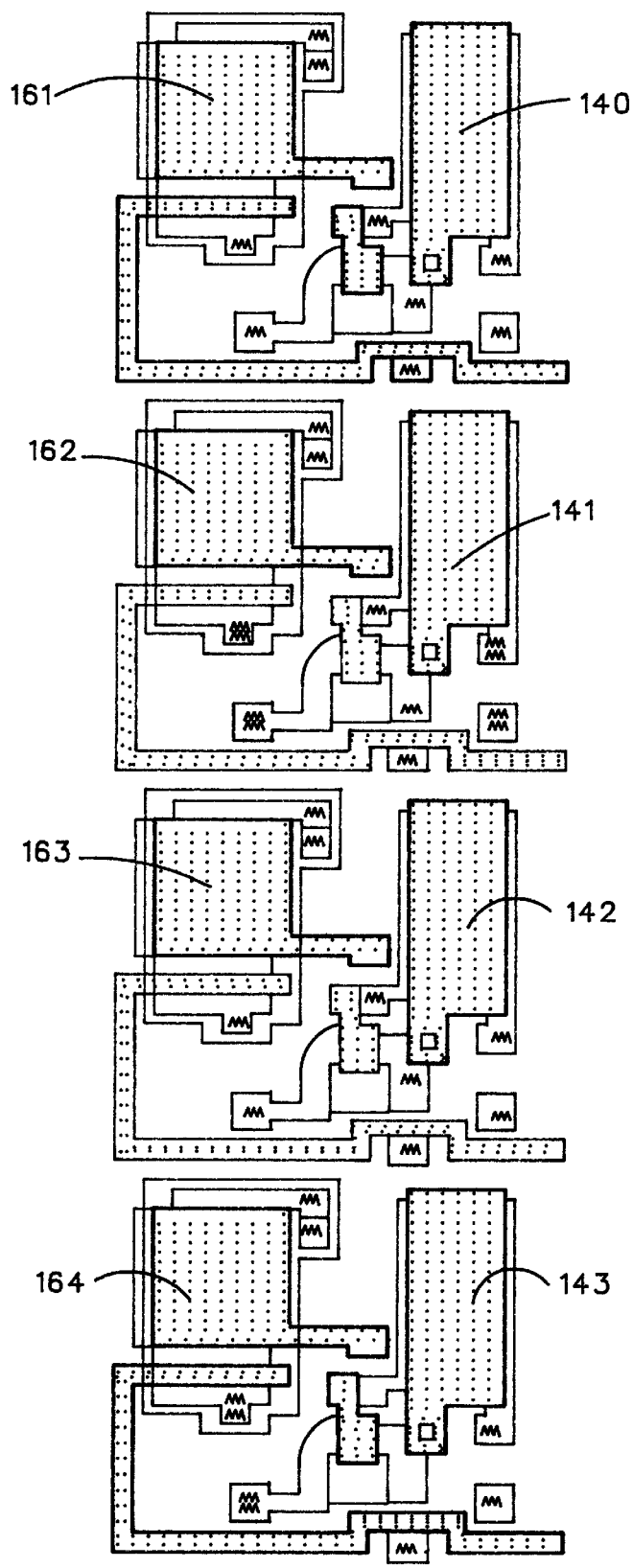
FIG. 7 shows the structure of FIG. 5 with the metal interconnect layer(s) omitted; and, FIG. 8 shows the structure of FIG. 6 with the metal interconnect layer(s) omitted.
Figure 8:
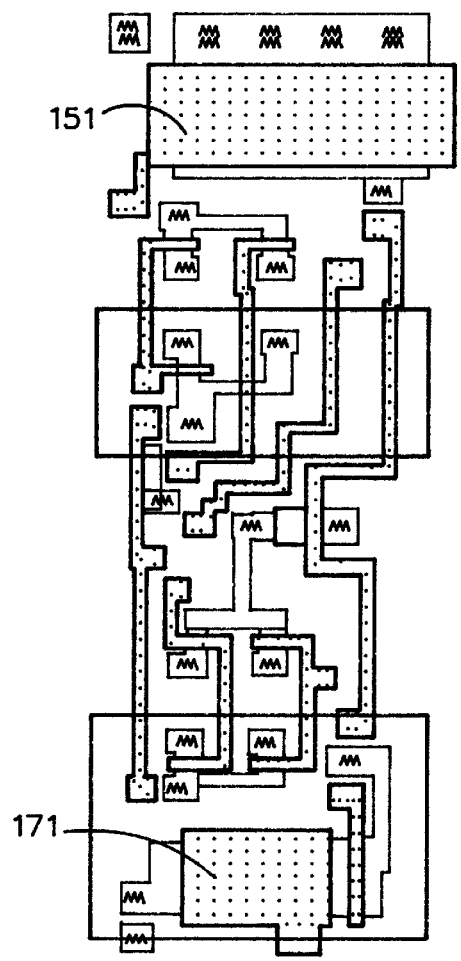

In FIGS. 7 and 8, the same structure is shown as in FIGS. 5 and 6 except that the metal interconnects and detector contacts have been removed to show the amplifier FET locations. In FIG. 7, PNP amplifier transistors 46, 45 and NPN switching transistor 65 are shown at 140, 141, 142 and 143, whereas the same transistors are shown at 151 in FIG. 8. The load transistors 71 are shown at 161, 162, 163 and 164 in FIG. 7, whereas the same transistor is shown at 171 in FIG. 8.

It should also be noted that the orientation of the amplifier transistors 151 (FIG. 8) is rotated 90° from the amplifier in transistors 140–143 in FIG. 7. Thus, the larger components have been reduced from eight in FIG. 7 to two in the invention of FIG. 8.

The advantages of retaining the same functions using less components, in smaller spaces, while obtaining equal performance by re-arrangement and combining offer considerable cost savings in design and improve the reliability factor.

What is claimed is:

1. A method of saving space and components under detectors for staring array systems by combining detector inputs to a common photodiode amplifier, comprising the steps of:

establishing sequential connections from a plurality of detector inputs to a closely spaced common photodiode amplifier by selecting a single path to the amplifier from each detector input at different times;

clamping each path to a source of potential to prevent signal transmission over the paths; and, releasing said clamping of the path selected to supply the amplifier whereby a four to one detector input to amplifier ratio saves about 50% detector spacing over a conventional four detector input to four amplifiers.

2. The method of claim 1, comprising the further steps of:

providing a different select circuit for selecting each single path;

applying different select voltage levels to the select circuits to clamp a path and to close a path;

providing a transistor in each path for passing detector signals when activated, and providing transistors in the select circuits for clamping when activated;

said voltage levels oppositely affecting the transistors in the select circuits and in the single paths.

3. The method of claim 1, wherein:

orienting said photodiode amplifier under said detector to a new position in order to save space by using only 40 microns×40 microns detector spacing by 4 said detectors and said common amplifier requiring only 6,400 square microns relative to 14,400 square microns for 4 detectors and 4 amplifiers.

4. Apparatus for saving space and components under detectors for staring array systems by multiplexing detector inputs for common amplification, comprising in combination:

a common photodiode amplifier;

said amplifier being closely spaced to said detectors;

electrical paths from the detectors to the amplifier;

a plurality of select circuits;

means for selecting each path by a different select circuit;

means for clamping each path over a different select circuit to a source of potential to prevent signal transmission over the paths;

means for releasing said clamping of the path selected to supply the amplifier and, said detectors being grouped as 4 detectors having their detector inputs multiplexed into a single common amplifier under 6400 square microns whereas conventional 4 detectors and 4 amplifiers require about 14,400 square microns.

5. The apparatus of claim 4, further comprising:

means for applying different select voltage levels to the means for selecting to clamp a path and to close a path;

transistors in the means for selecting and in said paths; and, said voltage levels oppositely affecting said transistors in the means for selecting and in the path to clamp a path on one voltage level and to close the same path on a different voltage level.

6. A method of saving space and components under detectors for staring array systems by combining detector inputs to a common photodiode amplifier, comprising the steps of:

establishing sequential connections from a plurality of detector inputs to a common photodiode amplifier by selecting a single path to the amplifier from each detector input at different times;

clamping each path to a source of potential to prevent signal transmission over the paths;

releasing said clamping of the path selected to supply the amplifier;

providing a different select circuit for selecting each single path;

applying different select voltage levels to the select circuits to clamp a path and to close a path;

providing a transistor in each path for passing detector signals when activated, and providing transistors in the select circuits for clamping when activated; and, said voltage levels oppositely affecting the transistors in the select circuits and in the single paths.

7. Apparatus for saving space and components under detectors for staring array systems by multiplexing detector inputs for common amplification, comprising in combination:

a common photodiode amplifier;

electrical paths from the detectors to the amplifier;

a plurality of select circuits;

means for selecting each path by a different select circuit;

means for clamping each path over a different select circuit to a source of potential to prevent signal transmission over the paths;

means for releasing said clamping of the path selected to supply the amplifier;

means for applying different select voltage levels to the means for selecting to clamp a path and to close a path;

transistors in the means for selecting and in said paths; and, said voltage levels oppositely affecting said transistors in the means for selecting and in the path to clamp a path on one voltage level and to close the same path on a different voltage level.

* * * * *